United States Patent [19]

Dube

[11] 4,397,884

[45] Aug. 9, 1983

[54] PROCESS FOR STABILIZING IN TIME A PIEZOELECTRIC RESONATOR

[75] Inventor: Georges Dube, Sartrouville, France

[73] Assignee: Compagnie d'Electronique et de Piezo-Electricite, Sartrouville, France

[21] Appl. No.: 323,075

[22] Filed: Nov. 19, 1981

[30] Foreign Application Priority Data

Nov. 21, 1980 [FR] France ................................ 80 24803

[51] Int. Cl.$^3$ ................................................ B05D 3/12

[52] U.S. Cl. ........................................ 427/38; 427/100

[58] Field of Search .................................. 427/38, 100

[56] References Cited

U.S. PATENT DOCUMENTS 2,989,799 6/1961 Mason ................................ 29/25.35

3,914,836 10/1975 Hafner et al. ...................... 29/25.35

OTHER PUBLICATIONS

Proceedings of the 27th Annual Frequency Control Symposium, Electronic Industries Association, J. Vig et al., "Surface Preparation and Characterization Techniques for Quartz Resonators", pp. 98–112.

Wescon Technical Papers, vol. 20, No. 20, 1976, M. Bloch et al. "Crystal Survey", pp. 32/3-1, 32/3-14.

*Primary Examiner*—James R. Hoffman

*Attorney, Agent, or Firm*—Oblon, Fisher, Spivak, McClelland & Maier

[57] ABSTRACT

The invention relates to piezoelectric resonators formed from a block of a crystalline material. During finishing of such resonators, some of the faces thereof, the distances between which define the frequency, are subjected to abrasive operations which alter the surface state of the network, with surface cracks, dislocations and fragmentations. The invention provides a process for implanting light ions on these faces (He, Li, Be) after finishing, by creating therein a layer of vitreous protection silica from the crystallized quartz.

8 Claims, 4 Drawing Figures

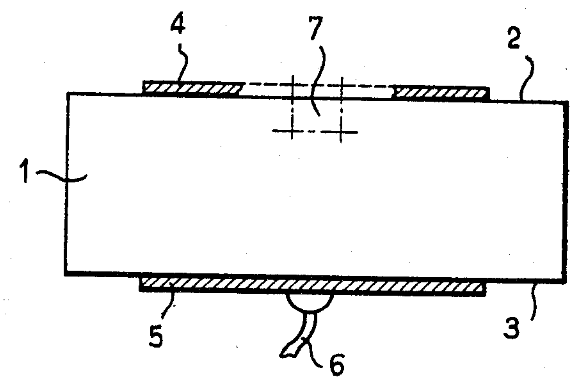
FIG.1a
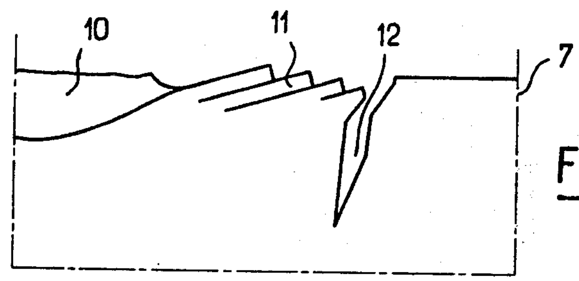
FIG.1b
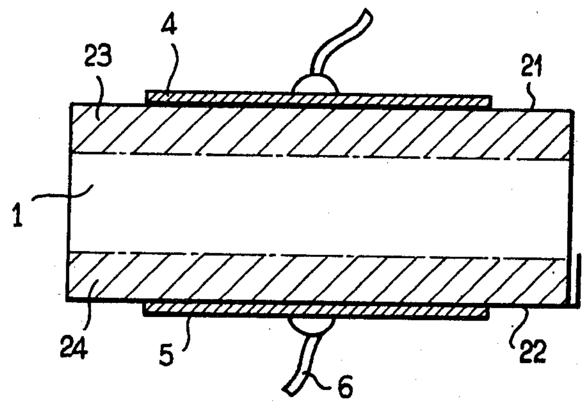
FIG_2

ΔF/F 1
2
1
2
3
4
5
6
7

PROCESS FOR STABILIZING IN TIME A PIEZOELECTRIC RESONATOR

BACKGROUND OF THE INVENTION

The present invention relates to the field of piezoelectric resonators used in applications where an oscillation frequency must be defined with high stability. This is the case for example with drive oscillators or frequency filters used in radio electricity and telephony.

Such resonators are formed from a monocrystalline material such as quartz, crystallized silica variety, cut in a block with a general parallel-epipedic shape, and having electrodes on two of its opposite faces for applying thereto the required electric voltages.

The frequency of a piezoelectric resonator depends on some of its dimensions, and it is adjusted by mechanical grinding operations in the presence of abrasive materials, in several successive steps, of rough shaping first of all then finishing.

The resonator is then provided with its electrodes, formed very often of thin metal layers deposited on the appropriate faces and, before use, is operated for a given duration in an electric formation or "ageing" circuit.

It has in fact been discovered that its working characteristics, the principal one of which is its oscillation frequency, change slowly at constant temperature during the first period of operation, before stabilizing at a fixed value, following an asymptotic law at this value; by way of order of size, a quartz resonator, oscillating at about 5 MHz, may require about 4000 hours before stabilizing at $1.10^{-9}$ per month of its nominal frequency.

Extensive researches carried out by the Applicant to discover the causes of this phenomenon have shown that the mechanical finishing operations were to a great extent the cause thereof. During the finishing of a quartz, the principal surfaces of the crystal are bruised. The abrasive element tears the surface and creates flakes which are removed by careful rinsing. Nevertheless, there still remain surface crevices and dislocations forming a thin heterogeneous layer which is called "disturbed zone." When this zone is exposed to humidity, erosion of the surface occurs and thus particles of quartz—and abrasive—break off.

In practice, despite a final chemical cleaning in an acid medium, the presence of this disturbed zone causes slow-changing phenomena to be established which explain the change in time of the resonator:

progressive diffusion of the metallic material of the electrodes in the disturbed crystalline network, that of quartz having a relatively penetrable or "open" structure;

penetration of water vapor, atmospheric impurities.

Furthermore, it is to be noted that the machining operations disturb the mechanical equilibrium of the block, by introducing stresses therein, the relaxation of which in the course of time is long.

It thus appears that it is the disturbed zone which is partly responsible for the above-mentioned changing phenomena and that the remedy should be the application of a protecting coating to this zone, welding together the flakes and closing up the cracks or crevices in the dislocated crystalline network. The use of external coatings has not up to present given satisfactory results showing an improvement in ageing.

SUMMARY OF THE INVENTION

According to the invention, a continuous protection layer made from a material identical to that of the crystal is formed on the surfaces of the crystal which have been subjected to mechanical finishing operations, this layer being formed from amorphous silica in the case of quartz. The fundamental feature of the invention is to form this layer directly from the crystalline material of the resonator itself, by a process for implanting chosen ions. The crystal is thus coated with a vitrified layer which protects it from the aggressions of the environment and, furthermore, the disturbed zone which was mentioned above is made homogeneous: the vitrification obtained causes surface dislocations and crevices to appear. Surprisingly, it has further been discovered that the treatment does not appreciably alter the oscillation frequency. It has for example been established that a quartz whose oscillation frequency is 20 MHz has an oscillation frequency which has not varied more than 1 KHz after treatment, which is quite negligible. A swelling of the crystal during treatment can in fact be observed, which compensates for the reduction in thickness of the piezoelectric wafer because of the ionic implantation. Since these two factors substantially counterbalance each other, this explains the very small variation in the oscillation frequency of the resonator before and after treatment.

Although the nature of the ions to be implanted may be chosen from a certain range of atomic masses, it applies particularly advantageously to the field of light ions, such as those of helium, lithium and beryllium since these ions penetrate more readily into the crystalline network. The density of the beam used will be variable depending on the type of ions used as well as the crystal to be treated. Generally, it has been discovered that a density of the order of $1.5\times10^{16}$ ions/cm$^2$ was perfectly suitable. The acceleration voltage will in all cases be less than 200 kV and preferably of the order of 100 kV. The period of treatment is variable depending on the value of the above parameters and may vary preferably from a few minutes to several tens of minutes. It has been discovered that in general a period of the order of 10 minutes was suitable. A man skilled in the art will vary these different parameters so that the amorphous layer obtained after treatment is preferably less than 1 micron. According to a preferred embodiment it has been discovered that a thickness of the order of 7500 Angstroem was quite suitable. This crystal is then reheated to a temperature less than the curie point and preferably of the order of 400° C. The duration of the heat treatment will be of the order of about an hour.

The formation of the outer protection layer thus eliminates the above-mentioned causes partly responsible for the long ageing of a resonator before stabilization.

Thus, more precisely, the invention forming the subject matter of the present patent consists of a process for stabilizing in time a crystalline piezoelectric resonator, formed of a block (1) of a material in the crystalline state, characterized in that it comprises an ionic implantation step on some of the faces (21, 22) of this block, ensuring the transformation to the vitreous state of the material up to a given depth (23, 24) in these faces.

BRIEF DESCRIPTION OF THE DRAWINGS

The invention will be better understood with the help of the following description, referring to the attached drawings in which:

FIG. 1 shows, in two parts (a) and (b), a sectional view of a quartz crystal piezoelectric resonator, after mechanical abrasion for finishing same, FIG. 2 shows a sectional view of a quartz crystal piezoelectric resonator, after finishing, and application in accordance with the invention of the process for stabilization of same in time by ionic implantation.

DESCRIPTION OF THE PREFERRED EMBODIMENT

Figure 3:
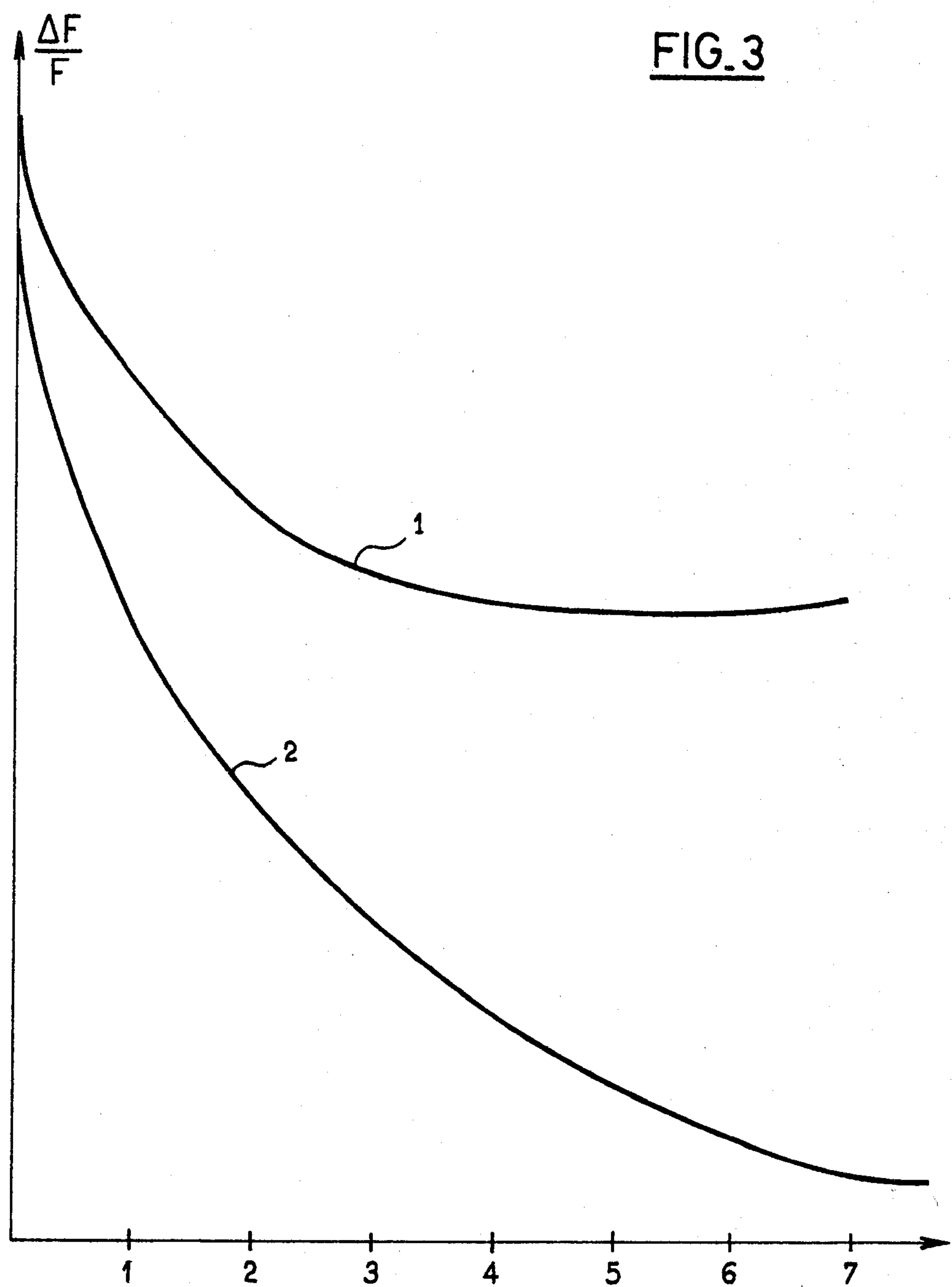
FIG. 3 shows comparative ageing curves between a treated crystal and a nontreated crystal.

FIG. 1 shows, in two parts (a) and (b), a sectional view of a quartz crystal piezoelectric resonator after mechanical abrasion for finishing same.

At (a) there is shown the whole of the resonator 1, with two principal faces 2 and 3 facing each other, whose spacing apart participates in the definition of the resonance frequency. These faces are covered with electrodes 4 and 5, in the form of thin metal layers, provided with connections such as 6 for applying the required electric voltages.

If we examine a very much enlarged portion 7 of the surface of the crystal, as shown at (b), it can be seen that the finishing operation has caused therein a series of alterations such as clearing the way of small fragments in the form of "flakes" such as 10, dislocations of the crystalline network such as 11 and "crevices" or cracks such as 12. These alterations have serious consequences, which have been described above, on the stabilization of operation of the resonator.

FIG. 2 shows a sectional view of a quartz crystal piezoelectric resonator, after mechanical abrasion finishing, but having undergone the process for stabilizing in time in accordance with the invention.

This process, which consists in an ionic implantation of light ions such as those of helium, lithium or beryllium, on the two facing faces 21 and 22, defines therein the formation of surface layers of amorphous silica 23 and 24 which corresponds to the state of the material known under the name of "vitreous". This continuous layer, created at the expense of the surface alterations of the resonator, eliminates these latter and protects the crystalline quartz from external aggressions, with the above-mentioned advantageous consequences; furthermore, the method of forming same from the quartz itself ensures a perfect bonding or "anchorage" to the crystal. Finally, this same method of formation quarantees that it does not disturb the oscillation/overvoltage characteristics of the resonator, which the heterogeneous layers deposited on the principal faces could not completely guarantee. Furthermore, this amorphous layer comes from the crystal itself and so does not cause any extra thickness;

EXAMPLE

Nine quartz wafers were disposed in a 3×3 matrix under a vacuum bell jar. These wafers were subjected for ten minutes to a beam of helium ions having a density of $1.5\times10^{16}$ $He^+$ ions per $cm^2$ with an acceleration voltage of 100 KeV. An amorphous silica layer (in the vitreous state) was obtained about 7500 Angstroem. The wafers were then turned over and, after evacuation of the bell jar, were subjected on the other face to the same treatment as above. After reheating to 400° C. for an hour, the wafers were ready to be coated with a metal layer (formation of the electrodes). The wafers were then mounted in a case according to the usual technique.

The resonators having undergone this treatment were subjected to ageing in an enclosure controlled by thermostat to 70° C. A group of identical resonators (but not treated) mounted in the same way in identical cases were subjected to the same ageing.

It should be noted that the above orders of size are given by way of example, and that any variation in the implantation process described, which retains the overall characteristics and results thereof, i.e. allowing the surface part of the quartz to be rendered amorphous over a thickness less than about a micron, is included within the scope of the invention.

Similarly, it is crystalline quartz which has been mentioned in the above description; the use of the implantation process, for other piezoelectric crystals, with the variants required by the differences in the materials, such as lithium tantalate and lithium niobate, is also included in the scope of the invention.

Finally, it should be noted that the use of the above-described implantation process for stabilizing the oscillation characteristics of a piezoelectric resonator, provides simultaneously an improvement in the characteristic curve of the variation of the frequency with respect to temperature. It will be further noted that the curvature (or opening) of this curve is modified at the inversion point, i.e. that the coefficient of the second order is reduced by a factor 2 to 3.

The results are shown in FIG. 3 which illustrates the relative frequency variations $\Delta F/F$ of the quartz wafer with respect to time.

Curve (1) relates to a crystal treated as in the above example, curve (2) relating to a crystal of the same origin but untreated.

It has been discovered that, for a crystal treated in accordance with the invention, the slope of the curve becomes very small after about three months whereas, for untreated crystals, this slope only lessens after about eight months ageing. However, the slope of the curve relative to untreated crystals remain always of the order of 3 to 4 times greater than that of the curve relative to treated crystals, even after a year or more.

What is claimed is:

1. A process for forming a piezoelectric resonator which has time stabilized oscillation characteristics comprising the steps of:

forming a block of material in the crystalline state;

performing mechanical finishing operations on said block of crystalline material;

subjecting at least one face of said block of crystalline material to ion implantation wherein said ions are one of helium, lithium and beryllium in order to transform said crystalline material on said at least one face of said block to the vitreous state to a predetermined depth of less than 1 micron.

2. The process according to claim 1 wherein two opposite faces of said block of crystalline material are subjected to ion implantation prior to covering each of said implanted faces with a respective electrode.

3. The process according to claim 2 including the further step of heating said block having the transformed faces to a temperature less than the curie point of said material.

4. The process according to claim 1 wherein said ion implantation is accomplished by a beam of ions having a density of approximately $1.5\times10^{16}$ ions per square meter and the acceleration voltage is less than 200 kV.

5. The process according to claim 1 wherein the steps of ion implantation and transformation include the further steps of:

disposing said block of material in a vacuum bell jar;

subjecting the upper face of said block to an ion beam for approximately 10 minutes; and turning said block of material over and subjecting the lower face to said ion beam for approximately 10 minutes.

6. The process according to claim 1 wherein said material in the crystalline state is one of quartz lithium tantalate and lithium niobate.

7. The process according to claim 1 wherein said material is lithium tantalate.

8. The process according to claim 1, wherein said material is lithium niobate.

* * * * *